(12) United States Patent
Park et al.

(10) Patent No.: US 8,876,998 B2
(45) Date of Patent: Nov. 4, 2014

(54) METHOD FOR MANUFACTURING FLEXIBLE FLAT DEVICE

(75) Inventors: Jong Hyun Park, Seoul (KR); Chang Dong Kim, Seoul (KR); Gee Sung Chae, Incheon (KR); Juhn Suk Yoo, Goyang-si (KR); Soo Young Yoon, Goyang-si (KR); Soon Wook Cha, Goyang-si (KR); Won Bong Jang, Seoul (KR); Jae Kyung Choi, Bucheon-si (KR)

(73) Assignee: LG Display Co., Ltd., Seoul (KR)

( * ) Notice: Subject to any disclaimer, the term of this patent is extended or adjusted under 35 U.S.C. 154(b) by 513 days.

(21) Appl. No.: 13/155,790

(22) Filed: Jun. 8, 2011

(65) Prior Publication Data

US 2012/0118478 A1 May 17, 2012

(30) Foreign Application Priority Data

Nov. 11, 2010 (KR) ........................ 10-2010-0111906

(51) Int. Cl.
*B29C 65/00* (2006.01)
*B32B 37/00* (2006.01)
*B32B 38/10* (2006.01)
*B32B 38/04* (2006.01)
*B32B 27/00* (2006.01)
*B29C 63/00* (2006.01)
*C09J 5/00* (2006.01)
*H01L 51/00* (2006.01)

(52) U.S. Cl.
CPC ............... *H01L 51/0097* (2013.01); *C09J 5/00* (2013.01); *C09J 2203/326* (2013.01); *C09J 2205/302* (2013.01); *C09J 2205/31* (2013.01); *Y02E 10/549* (2013.01); *H01L 51/003* (2013.01); *H01L 2251/5338* (2013.01)

USPC ..... 156/247; 156/249; 156/272.8; 156/273.3; 156/273.9; 156/275.5; 156/280; 156/289; 156/714

(58) Field of Classification Search
USPC ............... 156/60, 67, 99, 101, 102, 104, 106, 156/152, 230, 242, 244.11, 246, 247, 249, 156/272.2, 272.8, 273.3, 273.9, 275.7, 279, 156/280, 289, 701, 714, 719
See application file for complete search history.

(56) References Cited

U.S. PATENT DOCUMENTS

2004/0183220 A1* 9/2004 Dalmia ........................ 264/2.5
2011/0186829 A1   8/2011 Burroughes et al.

FOREIGN PATENT DOCUMENTS

| JP | 2000-243943 A | 9/2000 | |
| JP | 2000243943 A | * 9/2000 | .............. H01L 27/12 |
| WO | 2010/015833 | 2/2010 | |

OTHER PUBLICATIONS

Chinese Office Action for Application No. 2011103301613 dated Nov. 28, 2013.

* cited by examiner

*Primary Examiner* — Philip Tucker
*Assistant Examiner* — Brian R Slawski
(74) *Attorney, Agent, or Firm* — Morgan, Lewis & Bockius LLP

(57) ABSTRACT

Disclosed is a method for manufacturing a flexible device comprising: forming an adhesive layer on a support substrate; adhering a flexible substrate onto the adhesive layer; forming a device layer on the flexible substrate; and separating the support substrate from the flexible substrate, wherein the adhesive layer comprises a self-assembled monolayer (SAM).

13 Claims, 3 Drawing Sheets

UV irradiation

METHOD FOR MANUFACTURING FLEXIBLE FLAT DEVICE

CROSS REFERENCE TO RELATED APPLICATIONS

This application claims the benefit of the Korean Patent Application No. 10-2010-0111906 filed on Nov. 11, 2010, which is hereby incorporated by reference.

FIELD OF THE INVENTION

The present invention relates to a method for manufacturing a flexible flat device, and more particularly, to a method for manufacturing a flexible flat device, in which various processes are carried out under the circumstance that a flexible substrate is adhered onto a glass substrate, and the glass substrate is separated from the flexible substrate after completion of the various processes.

BACKGROUND OF THE INVENTION

A paper-like flexible device such as a flexible display device is capable of being bent or rolled so that it allows good portability and easy keeping. In this respect, the flexible device has been actively studied and developed as a next-generation device.

The flexible device is manufactured by forming several elements on a flexible substrate. For this, the flexible device, including the flexible substrate, is repetitively loaded into and unloaded from various apparatuses. The flexible properties of the flexible substrate, however, make it difficult to transfer the device during the manufacturing process.

The flexible properties of the flexible substrate, however, make it difficult to transfer the flexible substrate by the use of general transfer. Thus, for convenience of conveyance, the flexible substrate is transferred while being adhered onto a rigid glass substrate, and the various processes are applied to the flexible substrate adhered onto the rigid glass substrate. After completion of the various processes, the glass substrate is separated from the flexible substrate, thereby completing a flexible flat device.

Specifically, some efforts have been made to transfer and form elements, such as organic light-emitting device (OLED), on the flexible substrate while the flexible substrate is adhered to a rigid glass substrate via an adhesive layer made of hydrogenated amorphous silicon (a-Si:H).

To this date, however, this procedure for transferring and forming elements on the flexible substrate requires an additional plasma-enhanced chemical vapor deposition (PECVD) for formation of the adhesive layer made of the hydrogenated amorphous silicon (a-Si:H), and further requires an additional laser irradiation process for removing the adhesive strength of the adhesive layer.

Accordingly, more efficient procedure for transferring and forming elements on the flexible substrate would be beneficial in manufacturing process of a flexible device.

SUMMARY OF THE INVENTION

Accordingly, the present invention is directed to a method for manufacturing a flexible flat device that substantially obviates one or more problems due to limitations and disadvantages of the related art.

One aspect of the present invention is to provide a method for manufacturing a flexible device, which facilitates to enhance the efficiency of the manufacturing process.

Additional advantages and features of the invention is set forth in part in the description which follows and in part is apparent to those having ordinary skill in the art upon examination of the following or may be learned from practice of the invention. The objectives and other advantages of the invention may be realized and attained by the structure particularly pointed out below and by claims hereof as well as the appended drawings.

To achieve these and other advantages and in accordance with the purpose of the invention, as embodied and broadly described herein, there is provided a method for manufacturing a flexible device comprising: forming an adhesive layer on a support substrate; adhering a flexible substrate onto the adhesive layer; forming a device layer on the flexible substrate; and separating the support substrate from the flexible substrate, wherein the adhesive layer comprises a self-assembled monolayer (SAM).

It is to be understood that both the foregoing general description and the following detailed description of the present invention are exemplary and explanatory and are intended to provide further explanation of the invention as claimed.

DETAILED DESCRIPTION OF THE INVENTION

Reference will now be made in detail to some embodiments of the present invention, examples of which are illustrated in the accompanying drawings. Wherever possible, the same reference numbers will be used throughout the drawings to refer to the same or like parts.

Hereinafter, a flexible flat device according to the present invention will be described with reference to the accompanying drawings.

The following embodiments and Examples have been included to provide guidance to one of ordinary skill in the art for practicing representative embodiments of the presently disclosed subject matter. In light of the present disclosure and the general level of skill in the art, those of skill can appreciate that the following Examples are intended to be exemplary only and that numerous changes, modifications, and/or alterations can be employed without departing from the scope of the presently disclosed subject matter.

FIGS. 1A to 1D illustrate a method for manufacturing a flexible device according to one embodiment of the present invention.

Figure 1A:
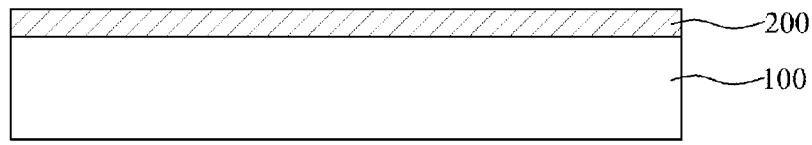
FIGS. 1A to 1D illustrate a method for manufacturing a flexible device according to one embodiment of the present invention.

First, as shown in FIG. 1A, an adhesive layer 200 is formed on a support substrate 100.

According to some embodiments of the present invention, the support substrate includes any substrate that is rigid enough to provide mechanical support to another layer placed on it. In further embodiments, the support substrate may be a transparent substrate, including, but not limited to, a glass substrate.

The adhesive layer 200 functions as an adhesive between the support substrate 100 and a flexible substrate described herein. In some embodiments, the adhesive layer 200 is formed of a material which has a good heat resistance to endure a high-temperature manufacturing process. In additional embodiments, the adhesive layer also has such adhesive strength to allow a good adhesion between the support substrate 100 and the flexible substrate during the manufacturing process, and/or to allow an easy separation of the support substrate 100 from the flexible substrate without carrying out an additional process after the manufacturing process.

The present invention relates to an adhesive layer with the above properties comprising a self-assembled monolayer (SAM).

As used herein, a SAM refers to a thin monolayer that is spontaneously coated onto a surface of a given substrate and is regularly aligned thereon. In detail, self-assembly refers to a phenomenon in which sub-unit molecules are spontaneously assembled due to interactions between the molecules to form a predetermined structure through a spontaneous reaction. A molecule used in forming a sub-unit of a SAM is formed of three portions. That is, the molecule includes a reaction group as a head portion that is coupled to a substrate, an alkane chain as a body portion that allows regular formation of a monolayer, and a functional group as a tail portion that determines a particular function of the monolayer.

Accordingly, the SAM in some embodiments of the present invention is an organized monolayer of molecules showing an affinity for a specific substrate material. In additional embodiments, the SAM is made of a material that allows both the heat resistance and adhesive strength.

For example, the SAM may comprise a silane-based compound, including, but not limited to a thiol containing silane-based compound, amine containing silane-based compound, and a mixture thereof.

The thiol containing silane-based compound includes, but is not limited to, the following chemical formulas 1 to 6 or the sale thereof

[Chemical formula 1]
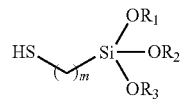

[Chemical formula 2]
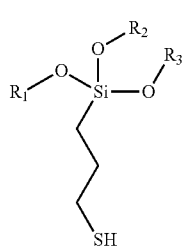

[Chemical formula 3]
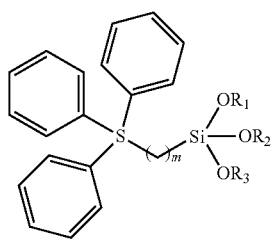

[Chemical formula 4]
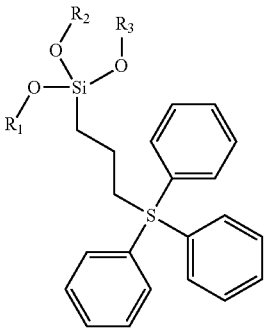

[Chemical formula 5]
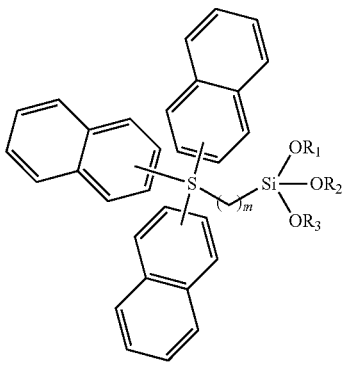

[Chemical formula 6]
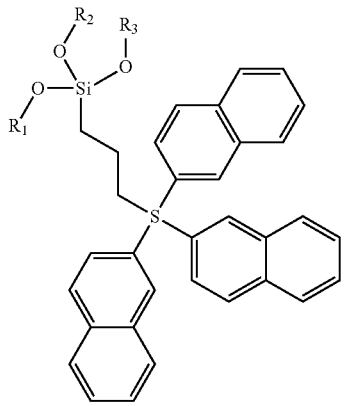

'$R_1$' to '$R_3$' are independently alkyl, functionalized alkyl, aryl, or alkoxy, including, but not limited to, $CH_3$ or $(CH_2)_n CH_3$; and 'm' and 'n' are independently an integer of 1, 2, 3, 4, 5, 6, 7, 8, 9, 10, or more. The benzene groups shown in the chemical formula herein may substituted and also may be replaced with other substituted or non-substituted aromatic group.

The amine containing silane-based compound includes, but not limited to, the following chemical formulas 7 to 12 or the salt thereof

[Chemical formula 7]
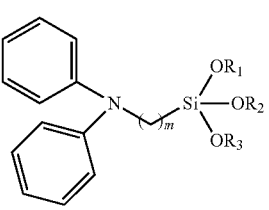

[Chemical formula 8]

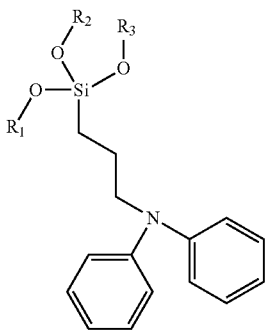

[Chemical formula 9]

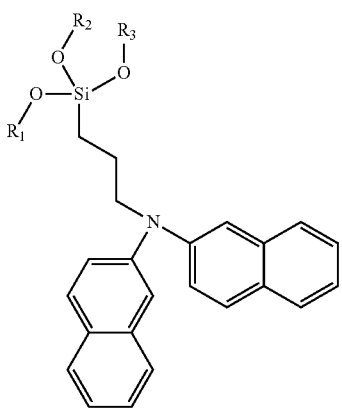

[Chemical formula 10]

[Chemical formula 11]

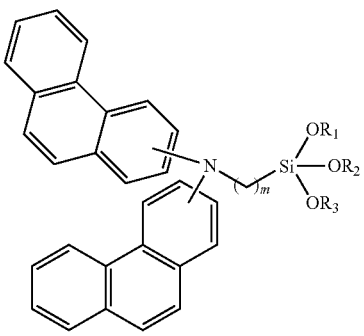

[Chemical formula 12]

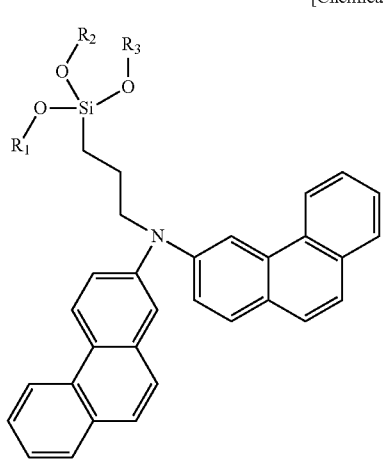

'$R_1$' to '$R_3$' are independently alkyl, functionalized alkyl, aryl, or alkoxy, including, but not limited to, $CH_3$ or $(CH_2)_n CH_3$; and 'm' and 'n' are independently an integer of 1, 2, 3, 4, 5, 6, 7, 8, 9, 10, or more. The benzene groups shown in the chemical formula herein may substituted and also may be replaced with other substituted or non-substituted aromatic group.

The SAM may be formed by a simple process, including, but not limited to, spin coating, dip coating, or spray coating method.

Figure 1B:
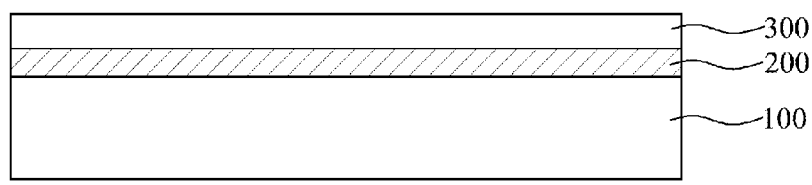

As shown in FIG. 1B, the flexible substrate 300 is adhered onto the adhesive layer 200.

The flexible substrate 300 may be made of common substrate materials, including, but not limited to polyethylene terphthalate, polyacrylate, polyesthersulphone, polyethylene naphthalate, polyimide, and the mixture thereof, where the polyimide is preferred in combination with the compounds disclosed herein. For example, the flexible substrate 300 may be made of various materials for polymer film which are generally known to those skilled in the art.

The above adhering process of the flexible substrate 300 onto the adhesive layer 200 may comprise positioning the polymer film, e.g. polyimide film, onto the adhesive layer 200, and optionally heating the polymer film positioned onto the adhesive layer 200 inside a high-temperature furnace.

Figure 1C:
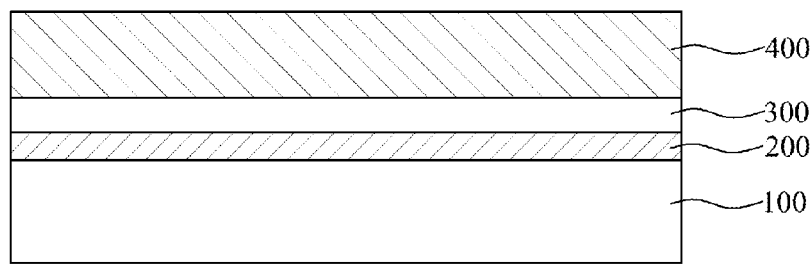

As shown in FIG. 1C, a device layer 400 is formed on the flexible substrate 300.

The device layer 400 may correspond to various types of display device to which the flexible device according to the present invention is capable of being applied.

In some embodiments, the device layer comprises various display devices, including, but not limited to, flat display devices, such as organic light-emitting device (OLED), and liquid crystal display (LCD).

When the device layer comprises the OLED, in additional embodiments of the present invention, the OLED may comprise a thin film transistor, an anode, a light-emitting layer, a cathode, and a sealing layer. In further embodiments, the light-emitting layer may comprise a hole injection layer, a hole transport layer, an electron transport layer, and an electron injection layer.

When the device layer comprises the LCD, in yet additional embodiments of the present invention, the LCD may comprise a thin film transistor, a pixel electrode, and a common electrode; and/or the LCD may comprise a light-shielding layer and a color filter layer.

The OLED or LCD described herein may be formed in various structures by various methods generally known to those skilled in the art.

Figure 1D:
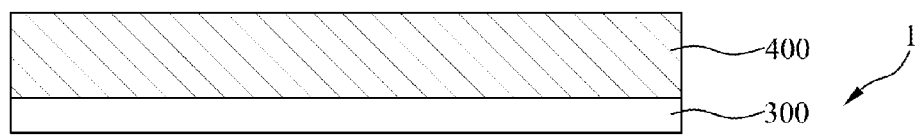
Figure 1D:
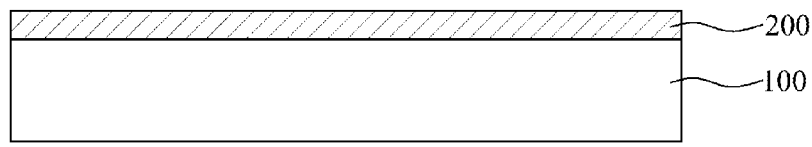

As shown in FIG. 1D, the support substrate 100 is separated from the flexible substrate 300, to thereby form a flexible device 1 with the device layer 400 on the flexible substrate 300. The adhesive layer may remain on the flexible substrate and/or on the support layer. In some embodiments, the support substrate can be cleaned and reused. The use of the adhesive layer according to further embodiments of the present invention permits the support substrate to be reclaimed or recycled for repeated use without the use of solvent.

The above process for separating the support substrate 100 from the flexible substrate 300 may be carried out in a mechanical method using a jig without an additional preliminary chemical reaction through laser irradiation.

In case of the method according to one embodiment of the present invention, the laser irradiation process for separation of the support substrate 100 is not carried out, and thus there is no potential adverse effect on the device layer 400 due to the irradiation.

FIGS. 2A to 2E illustrate a method for manufacturing a flexible device according to another embodiment of the present invention. In this embodiment, an additional process of UV irradiation is carried out for separation of a support substrate 100 from a flexible substrate 300. Hereinafter, the method for manufacturing the flexible device according to another embodiment of the present invention will be described with reference to FIGS. 2A to 2E.

Figure 2A:
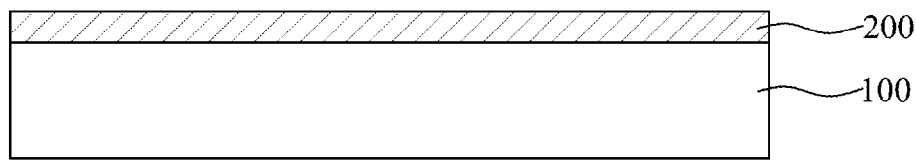
FIGS. 2A to 2E illustrate a method for manufacturing a flexible device according to another embodiment of the present invention.

First, as shown in FIG. 2A, an adhesive layer 200 is formed on a support substrate 100.

The support substrate 100 may be formed of a glass substrate, and the adhesive layer 200 may be formed of a self-assembled monolayer (SAM).

In some embodiments, the adhesive layer 200 comprises a silane-based compound as described herein.

Figure 2B:
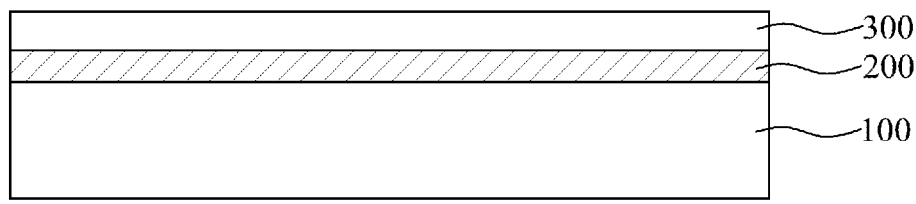

As shown in FIG. 2B, a flexible substrate 300 is adhered onto the adhesive layer 200.

In some embodiments, the flexible substrate 300 comprises polyimide. The above adhering process of the flexible substrate 300 onto the adhesive layer 200 may comprise positioning the polymer film such as polyimide onto the adhesive layer 200, and optionally heating the polymer film positioned onto the adhesive layer 200.

Figure 2C:
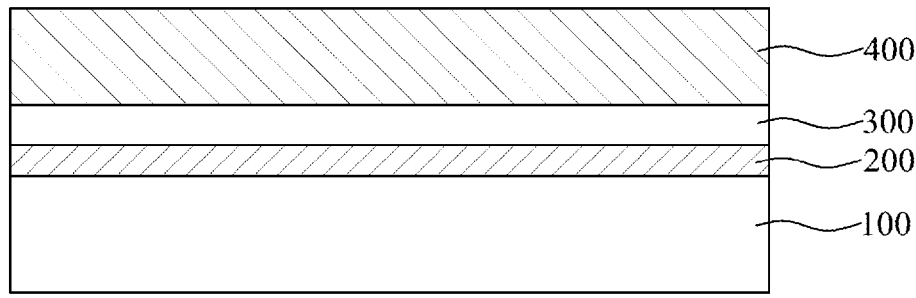

As shown in FIG. 2C, a device layer 400 is formed on the flexible substrate 300.

The device layer 400 may be formed of various display devices as described herein.

Figure 2D:
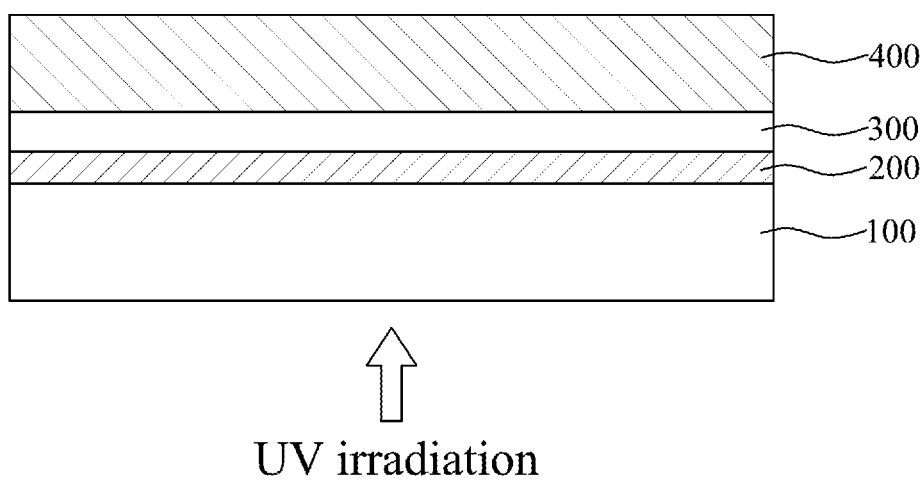

As shown in FIG. 2D, the lower surface of the support substrate 100 is irradiated with UV rays. This UV-ray irradiation enables a relatively-easy separation process between the flexible substrate 300 and the support substrate 100.

In some embodiments, instead of the UV-ray irradiation, it is possible to irradiate laser. In this case, it is preferable to use laser with a wavelength of about 500 nm or less. In further embodiments, 248 or 308 excimer laser may be used. As used herein, the term "about" refers to a range of values ±10% of a specified value. For example, the phrase "about 500 nm" includes ±10% of 500 nm, or from 450 nm to 550 nm.

Figure 2E:
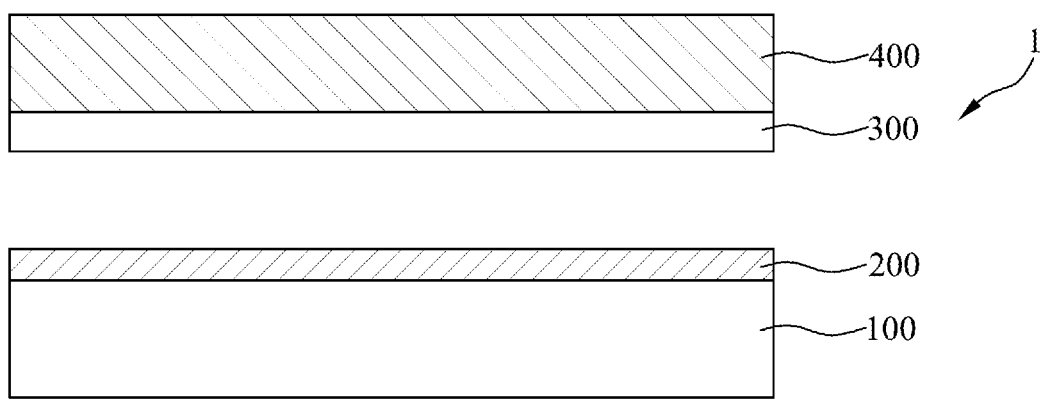

As shown in FIG. 2E, the support substrate 100 is separated from the flexible substrate 300, to thereby complete a flexible device 1 with the device layer 400 on the flexible substrate 300. As described previously, the adhesive layer may remain on the flexible substrate and/or on the support layer.

The above process for separating the support substrate 100 from the flexible substrate 300 may be carried out in a mechanical method using a jig.

As described herein, in comparison to the existing method for manufacturing the flexible device requiring the plasma-enhanced chemical vapor deposition (PECVD) method for creating an adhesive layer, the method for manufacturing the flexible device according to the present invention is simplified by the use of SAM.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for manufacturing a flexible device, the method comprising:

forming an adhesive layer on a support substrate;

adhering a flexible substrate onto the adhesive layer;

forming a device layer on the flexible substrate; and separating the support substrate from the flexible substrate, wherein the adhesive layer comprises a self-assembled monolayer (SAM), wherein the self-assembled monolayer comprises a silane-based compound selected from the group consisting of Chemical formulas 1, 3, 5, 7, 9, and 11, and the mixture thereof:

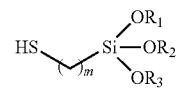

Chemical formula 1

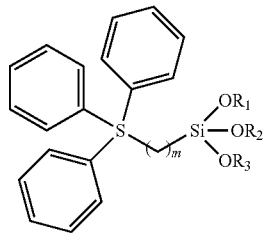

Chemical formula 3

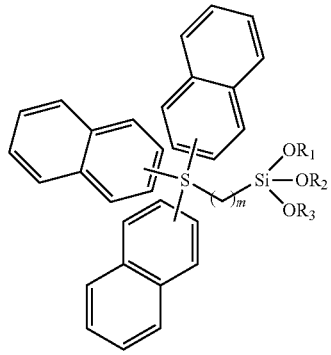

Chemical formula 5

Chemical formula 7

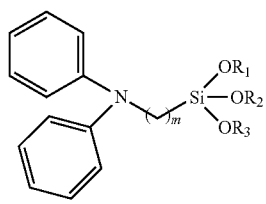

Chemical formula 9

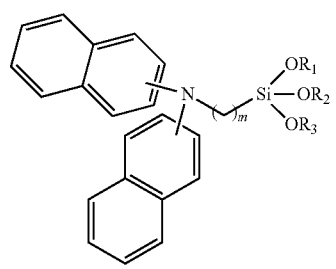

Chemical formula 11

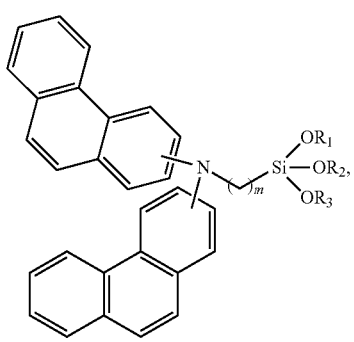

wherein 'R$_1$' to 'R$_3$' of the Chemical formulas 1, 3, 5, 7, 9, and 11 are independently alkyl, functionalized alkyl, aryl, or alkoxy, and wherein 'm' is an integer of 1 or more.

2. The method of claim 1, wherein the forming the adhesive layer on the support substrate comprises spin coating, dip coating, or spray coating an adhesive material on the support substrate.

3. The method of claim 1, wherein the silane-based compound is selected from the group consisting of the following Chemical formulas 2, 4, 6, 8, 10, and 12, and the mixture thereof:

Chemical formula 2

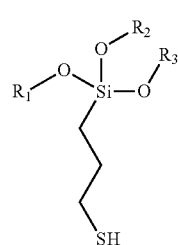

Chemical formula 4

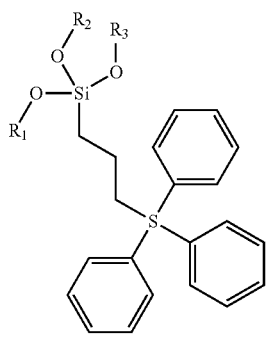

Chemical formula 6

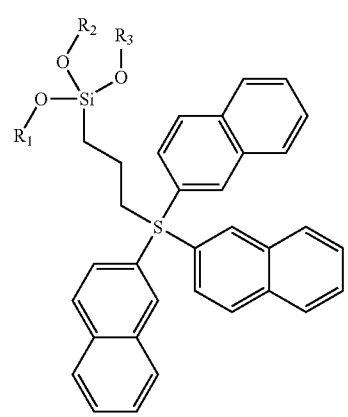

Chemical formula 8

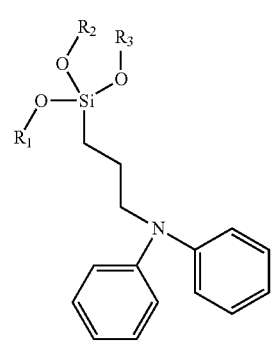

Chemical formula 10

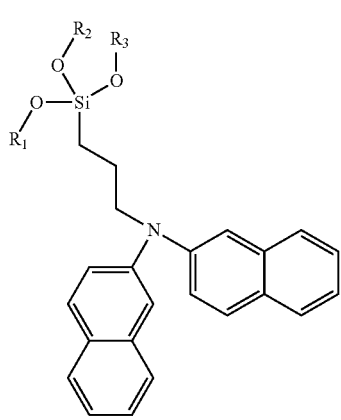

-continued

Chemical formula 12

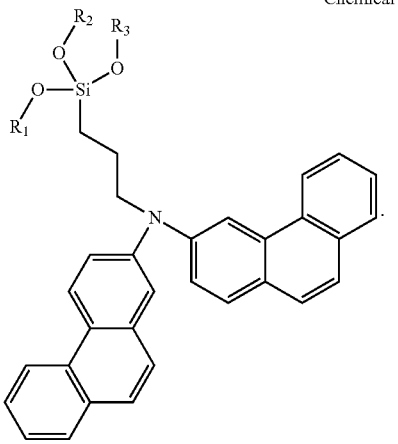

4. The method of claim 3, wherein:
'$R_1$' to '$R_3$' of the Chemical formulas 2, 4, 6, 8, 10, and 12 are independently $CH_3$ or $(CH_2)_n CH_3$, and
'n' is an integer of 1 or more.

5. The method of claim 1, wherein the support substrate comprises a glass substrate.

6. The method of claim 1, wherein the device layer comprises an organic light-emitting device (OLED) or liquid crystal display (LCD).

7. The method of claim 1, wherein the step of separating the support substrate from the flexible substrate is performed by a mechanical force.

8. The method of claim 1, wherein the flexible substrate comprises polyimide.

9. The method of claim 1, further comprising irradiating the lower surface of the support substrate prior to separating the support substrate from the flexible substrate.

10. The method of claim 9, wherein the irradiation is UV-ray irradiation or laser irradiation.

11. The method of claim 10, wherein wavelength of the irradiation is about 500 nm or less.

12. The method of claim 1, wherein 'm' is an integer of 10 or fewer.

13. The method of claim 4, wherein 'n' is an integer of 10 or fewer.

* * * * *